(12) United States Patent
Nakano et al.

(10) Patent No.: US 6,635,891 B1
(45) Date of Patent: Oct. 21, 2003

(54) HOLLOW-BEAM APERTURES FOR CHARGED-PARTICLE-BEAM MICROLITHOGRAPHY APPARATUS AND METHODS FOR MAKING AND USING SAME

(75) Inventors: Katsushi Nakano, Kawasaki (JP); Junji Nakamura, Tokyo (JP)

(73) Assignee: Nikon Corporation, Tokyo (JP)

( * ) Notice: Subject to any disclaimer, the term of this patent is extended or adjusted under 35 U.S.C. 154(b) by 242 days.

(21) Appl. No.: 09/668,838

(22) Filed: Sep. 22, 2000

(30) Foreign Application Priority Data

Sep. 22, 1999 (JP) .............................. 11-268489
Sep. 22, 1999 (JP) .............................. 11-268490
Apr. 10, 2000 (JP) .............................. 2000-108183

(51) Int. Cl.$^7$ .......................... G21K 5/10; H01J 37/08
(52) U.S. Cl. ................... 250/492.22; 250/492.1
(58) Field of Search ..................... 250/292, 396 R, 250/492, 492.1–492.3

(56) References Cited

U.S. PATENT DOCUMENTS 5,834,783 A  11/1998  Muraki et al. .............. 250/398
6,441,384 B1 * 8/2002 Kojima .................. 250/492.23

* cited by examiner

Primary Examiner—John R. Lee
Assistant Examiner—Christopher M. Kalivoda
(74) Attorney, Agent, or Firm—Klarquist Sparkman LLP

(57) ABSTRACT

For use in charged-particle-beam (CPB) microlithography apparatus, hollow-beam apertures are provided that define a substantially annular aperture having very narrow radial width. In a planar embodiment, triangular portions are provided at a midline of a first plane member. The triangular portions have respective angled edges and tips that narrow to a bridge supporting a circular portion. Semicircular cutouts are provided at the midline of respective forward edges of two second members. The radius of each semicircular cutout is slightly larger than the radius of the central portion. As the second members are urged together, a substantially annular aperture is formed between the semicircular cutouts and the central portion. The annular aperture can have extremely narrow width. In other embodiments, a block of beam-absorbing material defines a cylindrical portion having a diameter equal to the diameter of an axial beam-absorbing body, and defines a cylindrical opening, having a diameter equal to the intended outer diameter of the annular opening, beneath the cylindrical portion. Rotation-symmetric portions that are thin in a beam-transmission direction are removed selectively to form a hollow-beam aperture defining an opening that, in a plan view, is substantially annular except for portions missing from the ring.

27 Claims, 13 Drawing Sheets

LITHOGRAPHY STEP

HOLLOW-BEAM APERTURES FOR CHARGED-PARTICLE-BEAM MICROLITHOGRAPHY APPARATUS AND METHODS FOR MAKING AND USING SAME

FIELD OF THE INVENTION

This invention pertains to microlithography (projection-transfer of a pattern, as defined on a reticle or mask, to a substrate). Microlithography is a key technology used in the manufacture of microelectronic devices such as integrated circuits, displays, and the like. More specifically, the invention pertains to microlithography performed using a charged particle beam (e.g., electron beam or ion beam) as an energy beam. Yet more specifically, the invention pertains to charged-particle-beam (CPB) optical systems used in CPB microlithography apparatus, and to apertures used in such optical systems to form a hollow beam.

BACKGROUND OF THE INVENTION

The progressive reduction of the sizes of circuit elements in microelectronic devices has led to the development of microlithography apparatus that use an energy beam other than ultraviolet light, so as to achieve finer resolution than obtainable using optical microlithography (i.e., microlithography performed using light). One promising approach has centered on the use of a charged particle beam (e.g., electron beam) as a microlithographic energy beam. Because the rectilinearity (and hence the resolution) of an electron beam tends to be better than of a light beam, microlithography apparatus using an electron beam have the potential of accurately exposing a pattern having smaller pattern elements than is possible using optical microlithography.

Charged-particle-beam (CPB) microlithography apparatus at their current state of development tend to exhibit low throughput (number of wafers or substrates that can be processed microlithographically per unit time). One way in which to increase throughput is to increase the beam current of the charged particle beam. However, increasing the beam current causes an accompanying increase in the particle density within the beam, which tends increasingly to aggravate the "Coulomb effect." The Coulomb effect arises from electrostatic (Coulombic) repulsion between particles of like charge in the beam. The Coulomb effect causes, inter alia, beam blur, which substantially degrades the achievable pattern-transfer resolution obtained with CPB microlithography.

U.S. Pat. No. 5,834,783 discloses an exemplary technology for reducing the Coulomb effect in electron-beam microlithography. Specifically, the electron beam is made hollow (i.e., is configured to have a ring-shaped or annular transverse sectional profile) by passing the beam through a hollow-beam aperture. A hollow beam greatly reduces Coulombic repulsion between the electrons in the beam and, as a result, reduces the Coulomb effect. A typical hollow-beam aperture comprises an electron-absorbing plate defining a substantially ring-shaped (annular) through-hole and a circular center portion. The annular through-hole typically has multiple struts extending radially across it that serve to support the center portion. The center portion desirably absorbs electrons incident on it as other electrons pass directly through the annular through-hole. The hollow-beam aperture normally is situated on an optical axis at a location in the electron-optical system where electrons emitted by an upstream source converge (this location is termed a "crossover").

The diameter of the beam at the crossover of a CPB-microlithography apparatus typically is approximately 100 $\mu$m. Hence, the size of a hollow-beam aperture placed at the crossover must be very small. Specifically, the diameter of the circular center portion of the hollow-beam aperture should be about 60 $\mu$m, and the radial width of the annular through-hole should be about 20 $\mu$m. The hollow-beam aperture should be made of a material that effectively blocks (absorbs) charged particles (except for particles passing through the annular through-hole) and has a high melting point. Molybdenum is a particularly useful material for this purpose.

The conventional method for fabricating a hollow-beam aperture includes machining arc-shaped openings in a molybdenum sheet using an end mill or analogous cutting tool, as shown in FIG. 17. However, this method is incapable of cutting an annular through-hole having a very narrow radial width. A more suitable alternative method is electric-discharge machining (EDM), in which an electrode is situated very near the workpiece (molybdenum plate) where the aperture is to be formed. For example, the electrode is situated 20 $\mu$m from the workpiece. High-voltage pulses are applied between the electrode and the workpiece to form an electrical arc across the gap between the electrode and the workpiece. The narrowest aperture that can be formed using EDM is equal to the diameter of the electrode plus 40 $\mu$m (20-$\mu$m gap on each side of the electrode). In other words, it is impossible to cut a 20-$\mu$m wide annular opening using EDM. Therefore, no practical method currently exists for making a hollow-beam aperture having a desired width for placement at a beam crossover.

SUMMARY OF THE INVENTION

In view of the shortcomings of the prior art summarized above, an object of the invention is to provide hollow-beam apertures, for use in CPB microlithography, having very small radial widths, such as a radial width of approximately 20 $\mu$m. Another object is to provide methods for manufacturing such hollow-beam apertures and to provide CPB microlithography apparatus comprising such hollow-beam apertures.

To such ends, and according to a first aspect of the invention, hollow-beam apertures are provided for incorporation and use in a charged-particle-beam (CPB) microlithography apparatus. A first embodiment of such an aperture comprises a first member, multiple second members, and a circular center member made of a CPB-absorbing material. The center member is supported relative to the first member by support bars extending radially from the first member to the center member. The second members are situated between the support bars and the first member, and are displaceable relative to the first member radially toward the center member. The second members each have a distal edge. The distal edges are configured to engage the support bars whenever the second members are displaced maximally toward the center member. The distal edges each define a cutout having a respective edge configured as an arc having a radius greater than the radius of the center member. Whenever the second members are displaced maximally toward the center member, an annular aperture is defined between the center member and the cutouts. The aperture is "substantially annular," i.e., annular except for the support bars extending across the aperture to the center member.

A respective spring can be situated relative to the first member and extending to each of the second members. Each spring is configured to urge the respective second member toward the center member. The springs desirably are contiguous with the first and second members, thereby connecting the respective second members to the first member.

The first member desirably defines angled edges in a region between the second members. In such a configuration, each second member defines angled edges that conform to and contact corresponding angled edges of the first member in a manner, whenever the second members are displaced maximally toward the center member, serving to maintain concentricity of the cutouts relative to the center portion. In such a configuration, the angled edges of the second members effectively "fit" into respective spaces defined by the angled edges of the first member. As the second members are urged closer to the center body, the engaging angled edges of the first and second members cause the second members to self-align relative to the first member and the center member, thereby assuring concentricity of the cutouts in the distal edges with the center member.

In a second embodiment of a hollow-beam aperture according to the invention, a first member defines a cutout having a radial dimension. A cylindrical beam-absorbing member is disposed relative to the first member. The beam-absorbing member has an axis and a radius, wherein the radius is smaller than the radial dimension of the cutout. Multiple support bars support the beam-absorbing member relative to the first member and concentrically with the cutout such that the axis of the beam-absorbing member is perpendicular to the plane of the first member, and the beam-absorbing member extends through the cutout. The first member, beam-absorbing member, and support bars can be machined from a single body of beam-absorbing material. This embodiment also includes a second member (desirably planar in configuration) that defines a circular cutout having a radius no larger than the radius of the cutout in the first planar member and larger than the radius of the beam-absorbing member. The second member desirably is configured for superposed attachment to the first member such that the cutout of the second member is coaxial with the beam-absorbing member, and the beam-absorbing member also extends through the second cutout. The radius of the cutout in the second member desirably is smaller than the radius of the cutout in the first member. Hence, when the first and second members are joined, they define a substantially annular aperture that is contiguous except at the support bars.

In this second embodiment, the second member can be manufactured after manufacturing the first member. Specifically, the beam-absorbing member of the first member can be used as an EDM electrode for forming the cutout in the second member. Using such a technique, the cutout in the second member readily can be configured concentrically with the beam-absorbing member. Furthermore, this technique allows the cutout in the second member to be formed having a radius that is only 20 μm greater than the radius of the beam-absorbing member.

By providing such a narrow annular aperture, Coulomb effects in the CPB microlithography apparatus are controlled effectively, especially whenever the subject hollow-beam aperture is placed at a crossover.

In a third embodiment of a hollow-beam aperture according to the invention, a main body defines a circular opening having an axis. A beam-absorbing body is situated concentrically relative to the circular opening and is connected to the main body by at least one support bar contiguous with the main body and the beam-absorbing body. The beam-absorbing body has a radius that is smaller than the radius of the circular opening. The main body defines at least one void situated relative to the circular opening and the beam-absorbing body. The void is configured so as to cause the circular opening and beam-absorbing body to define a substantially annular aperture, when the hollow-beam aperture is viewed along the axis, extending through the main body and concentric with the beam-absorbing body.

To form the structure of this embodiment, machining of the main body is performed from multiple directions. If machining were performed only from one direction, according to conventional practice, then an annular aperture having a sufficiently narrow radial width (e.g., 20 μm) could not be formed. By machining from multiple directions, the requisite narrow radial width can be obtained, even if the dimensions of the individual machining cuts are large.

As noted above, the resulting aperture that is formed is "substantially annular." Such an aperture can be contiguous except for support bars traversing it. Furthermore, whereas a substantially annular aperture generally is circular, the term "substantially annular" also includes apertures that are, for example, elliptical (but not elliptical to such an extent that significant anisotropy would be a problem during use). The term also includes apertures not having a uniform radial width around the circumference of the aperture (but again, not to such an extent that significant anisotropy would result).

In a first example of this third embodiment, the at least one void comprises first and second voids, which can be situated on opposite sides of the axis. Each of the first and second voids can be cylindrical, with respective axes that are parallel to each other and perpendicular to the axis of the beam-absorbing body.

In another example, each of the first and second voids extends, at an angle relative to the axis, through the main body to the circular opening. In this second example, each of the first and second voids can be rectangular or trapezoidal in profile (in the latter configuration, the voids have tapered sides).

In this embodiment, the beam-absorbing body and the circular opening desirably are each defined by respective portions of the main body that are relatively thick in a beam-transmission direction and are separated from each other by a portion of the main body that is relatively thin in the beam-transmission direction. In such a configuration, the voids desirably are machined so as to remove some of the portion that is thin in the beam-transmission direction, leaving the support bar defined by remaining portions that are relatively thin in the beam-transmission direction. The beam-absorbing body desirably is rotationally symmetric (about the axis). The resulting substantially annular aperture has a radial width equal to the difference between the radius of the beam-absorbing body and the radius of the circular opening. The achievable radial width is very narrow, including as narrow as 20 μm.

Further with respect to this embodiment, the machining steps can be performed in any order, with the same advantageous results obtained in any event.

The dimensional accuracy of the annular aperture (beam-transmitting portion) is determined by the accuracy of the diameter of the beam-absorbing body, and by the dimensional accuracy of the remaining portion that is relatively thin in the beam-transmission direction. Hence, the dimensional accuracy of the annular aperture is not largely dependent on the accuracy of machining operations performed to form the voids (by removing some of the "portion that is relatively thin in the beam-transmission direction"). As a result, the machining operations performed to form the voids can be relatively "rough" and are thus easy to perform.

The circular opening can have a truncated conical profile as viewed along a direction perpendicular to the axis of the beam-absorbing body, wherein the circular opening extends into the main body from a first surface of the main body. In this configuration, the main body can define multiple (e.g., at least four) voids each having a respective axis that is parallel to the axis of the beam-absorbing body. The voids extend into the main body from a second surface of the main body opposite the first surface. The voids desirably are arranged such that their respective axes are equally spaced from one another about the axis of the beam-absorbing body in a rotationally symmetric manner (to eliminate anisotropy). Each of the voids intersects, within the main body, a respective portion of the circular opening in a partially overlapping manner. The partially overlapping portion of each void with the circular opening forms a respective portion of the substantially annular aperture, while intervening non-overlapping portions form the beam-absorbing body and support bars. The radial width of the substantially annular aperture can be determined by adjusting the diameters of the voids relative to the diameter of the circular opening. Hence, a substantially annular aperture is formed, having an extremely narrow radial width, by a simple process involving machining performed in only two directions.

Either of the machining steps (machining the circular opening and machining the multiple voids) may be performed before the other step.

Each of the voids can have a truncated conical profile as viewed along a direction perpendicular to the axis of the beam-absorbing body. The conical profiles provide tapered sides that scatter incident charged particles back toward the incident beam at an angle. This can reduce disturbances near the outside of the beam due to multi-path reflection.

In yet another example, the circular opening can be annular in profile with tapered outer sides and tapered inner sides, thereby forming a beam-absorbing body that is conical relative to the axis. Such a circular opening is formed on a first surface of the main body. The voids can be machined into a second surface of the main body opposite the first surface. Hence, machining is easy because it is performed from only two directions. Also, in this example, the edge of the annular aperture can be made sharp, wherein the edge is located in a plane perpendicular to the axis of the beam-absorbing body. Also because both the inner and outer edges of the annular aperture are determined by the same machining operation, they automatically reside on the same plane, resulting in highly accurate relative lateral positioning of beam-absorbing portions of the hollow-beam aperture. This eliminates anisotropy of the hollow beam formed by the aperture.

According to yet another embodiment, a hollow-beam aperture according to the invention comprises a charged-particle-stopping member defining a cutout extending along an axis through a thickness dimension of the charged-particle-stopping member. The aperture also comprises a support member that defines multiple openings. The support member is situated relative to the cutout in the charged-particle-stopping member so as to collectively define a substantially annular aperture coaxial with the axis. The hollow-beam aperture also can include a reinforcing member defining an opening that is coaxial with the axis. The charged-particle-stopping member, the support member, and the reinforcing member (if included) can be integrated as a unitary construct.

According to another aspect of the invention, methods are provided for manufacturing a hollow-beam aperture for use in a charged-particle-beam (CPB) microlithography apparatus. According to an example embodiment of a method according to the invention, a main body is provided made of a CPB-absorbing material. On a first surface of the main body, a circular opening is machined having an axis. On a second surface of the main body opposite the first surface, the main body is machined to define a beam-absorbing body concentrically relative to the circular opening. The beam-absorbing body has a radius smaller than the radius of the circular opening. The circular opening and the beam-absorbing body each have a relatively thick dimension in a beam-transmission direction and are separated from each other by a portion of the main body that is relatively thin in the beam-transmission direction. The main body is machined further to define at least one void situated relative to the circular opening and the beam-absorbing body. The void is configured so as to cause the circular opening and the beam-absorbing body to define a substantially annular aperture, when viewed along the axis, extending through the main body and concentric with the beam-absorbing body.

The circular opening can be machined to have a truncated conical profile as viewed along a direction perpendicular to the axis, and to extend into the main body from a first surface of the main body.

The step of machining the circular opening can comprise machining an annular groove in the first surface. In such an instance, the voids are machined into the second surface so as to intersect the annular groove. Hence, a substantially annular aperture is formed having tapered inner sides and tapered outer sides, as summarized earlier above.

According to another embodiment of a method according to the invention, a main body is provided that is made of a CPB-absorbing material. On a first surface of the main body, a circular opening is machined that has an axis and a radius. The circular opening defines a beam-absorbing body having a radius smaller than the radius of the circular opening. The circular opening and the beam-absorbing body each have a relatively thick dimension in a beam-transmission direction and are separated from each other by a portion of the main body that is relatively thin in the beam-transmission direction. The main body is machined to define at least one void situated relative to the circular opening and the beam-absorbing body. The void is configured so as to cause the circular opening and the beam-absorbing body to define a beam-transmitting aperture that is concentric with the beam-absorbing body and substantially annular in profile when viewed along the axis. The beam-transmitting aperture extends through the portion of the main body, between the beam-absorbing body and the circular opening, that is relatively thin in the beam-transmission direction.

According to yet another embodiment of a method according to the invention, a main body is provided having first and second main surfaces and a thickness dimension extending along an axis between the first and second main surfaces. Multiple second openings are defined, extending from the first main surface into the thickness dimension. The second openings are situated radially symmetrically relative to the axis. A third opening is defined extending from the second main surface into the thickness dimension. The third opening is situated coaxially with the axis and intersects the second openings in the thickness dimension so as to define a substantially annular aperture as viewed along the axis.

The foregoing and additional features and advantages of the invention will be more readily apparent from the following detailed description, which proceeds with reference to the accompanying drawings.

BRIEF DESCRIPTION OF THE DRAWINGS

FIG. 6(d) is a plan view.

FIG. 8(d) is a plan view.

DETAILED DESCRIPTION

The invention is described below in the context of multiple representative embodiments. However, it will be understood that the invention is not limited to those embodiments.

First Representative Embodiment

Figure 1:
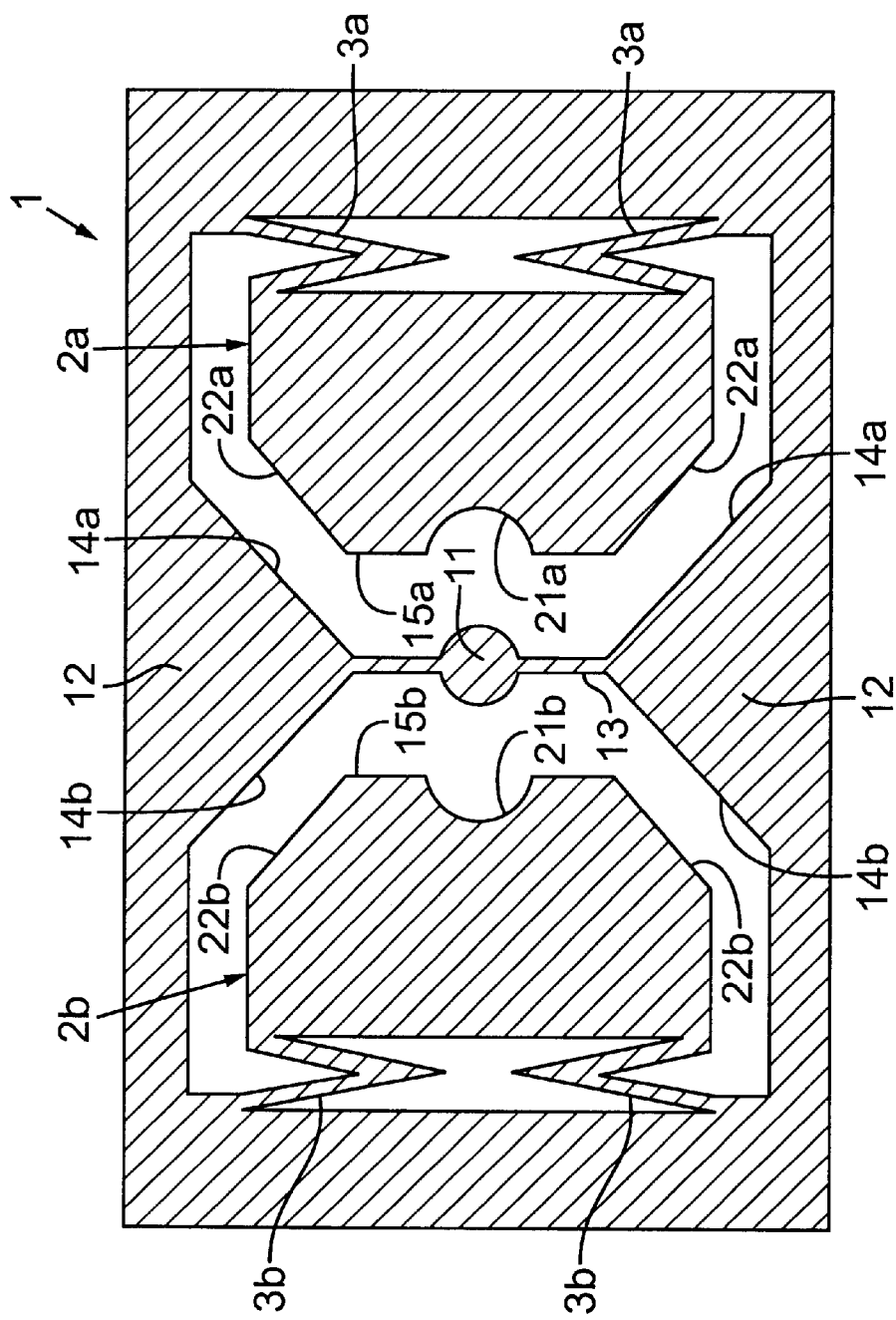
FIG. 1 is a plan view of a hollow-beam aperture according to a first representative embodiment of the invention.

A plan view of a hollow-beam aperture according to this embodiment is shown in FIG. 1. The FIG. 1 embodiment is substantially planar in configuration and includes a first member 1 and multiple second members 2a, 2b. The first member 1 is attached to the second planar members 2a, 2b by respective flexible members 3a, 3b. The first planar member 1 includes opposing triangular portions 12 of which the respective apices are connected together by a narrow bridge 13. In the middle of the bridge 13 is a circular portion 11. The triangular portions 12 each have opposing edges 14a, 14b, and the second members 2a, 2b each have opposing edges 22a, 22b, respectively. The respective distal ends 15a, 15b of the second members 2a, 2b define respective semicircular cutouts 21a, 21b. Each of the semicircular cutouts 21a, 21b has a radius slightly larger (by approximately 20 µm) than the radius of the circular portion 11. The edges 22a, 22b are configured to engage the edges 14a, 14b, respectively, in a conformable manner. In such a configuration, the bridge 13 and triangular portions 12 support the circular portion 11.

The first member 1, second members 2a, 2b, and the flexible members 3a, 3b desirably are formed as a single unit as shown. Alternatively, these members can be separate from each other. Also, the flexible members 3a, 3b are not required. However, they are desirable because they simplify engagement of the second members 2a, 2b with the first member 1 (which occurs whenever the edges 14a, 14b engage the respective edges 22a, 22b). The flexible members 3a, 3b desirably are sufficiently thin to allow flexible expansion and contraction of the members. A unified structure (including the members 1, 2a–2b, and 3a–3b) can be manufactured (e.g., by EDM) from a 0.5-mm thick sheet of heat-resistant material (e.g., W, Mo, or sintered graphite).

Figure 2A:
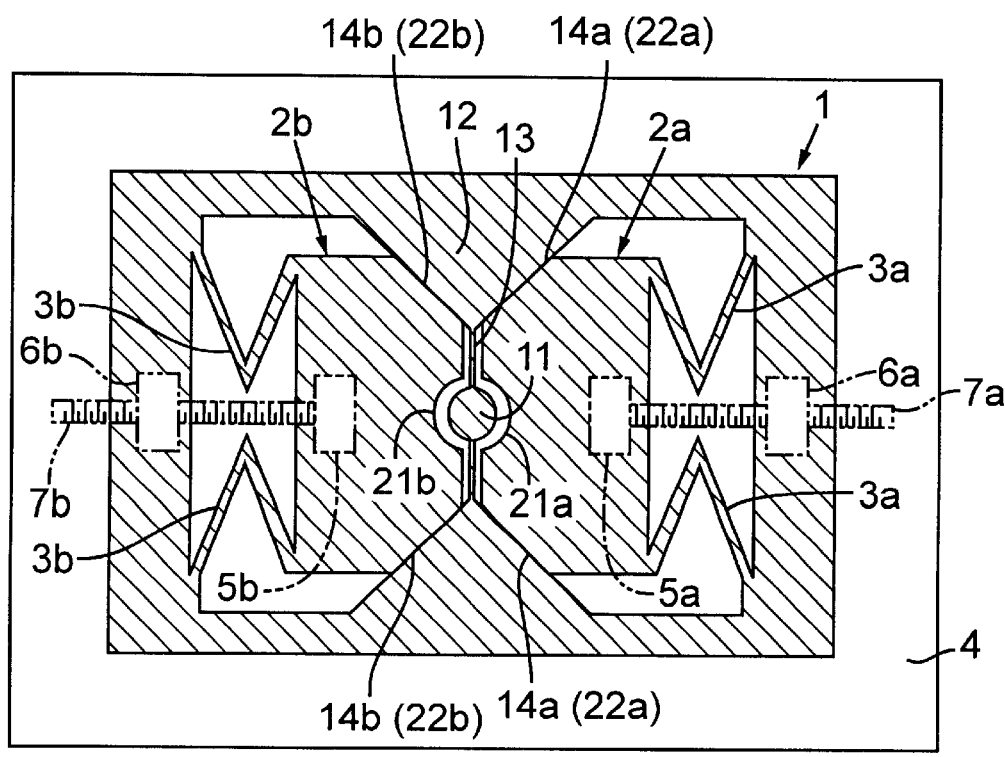
FIGS. 2(a)–2(b) plan and elevational sectional views, respectively, showing certain other details of the FIG. 1 embodiment.
Figure 2B:
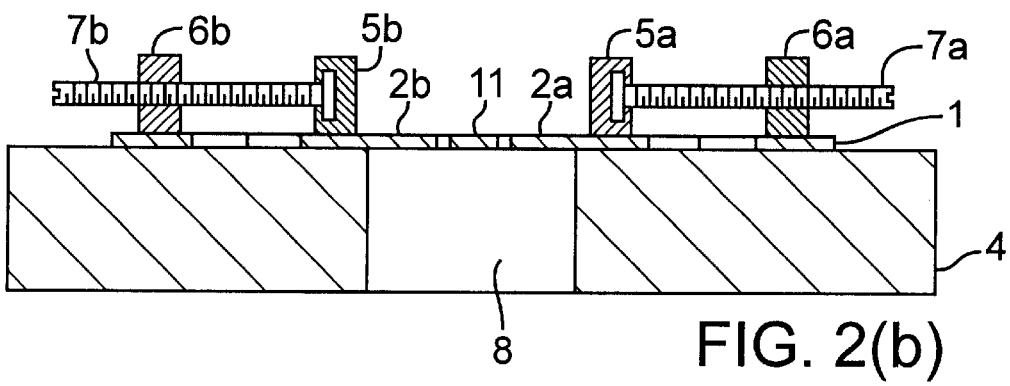

For use as a hollow-beam aperture, the FIG. 1 structure is configured further, as shown in FIGS. 2(a)–2(b), to include a support base 4, respective movable members 5a, 5b, nuts 6a, 6b, and screws 7a, 7b. FIG. 2(a) is a plan view, and FIG. 2(b) is an elevational section through the midline of FIG. 2(a). The first member 1 is mounted to the support base 4. The support base 4 defines a centrally located through-hole 8. The movable members 5a, 5b are affixed to the respective second members 2a, 2b, and the nuts 6a, 6b are attached to opposite ends of the first member 1. A respective screw 7a, 7b is attached rotatably to each movable member 5a, 5b is threaded through the respective nut 6a, 6b. By rotating the screws 7a, 7b, the respective second members 2a, 2b can be moved closer together or farther apart. Such movements of the second members 2a, 2b are opposed by a respective force produced by the respective flexible member 3a, 3b.

As the second members 2a, 2b move toward each other, the edges 14a, 14b eventually contact the edges 22a, 22b, respectively. After such contact, further turning of the screws 7a, 7b causes the respective second members to move further together relative to the triangular portions 12 until the respective distal edges 15a, 15b contact the lateral edges of the bridge 13. The first member 1 and second members 2a, 2b are shaped such that, whenever the second members 2a, 2b are moved maximally together in this manner, no gaps exist between the distal edges 15a, 15b and the bridge 13 or between the edges 14a, 22a and 14b, 22b. Also, whenever the second members 2a, 2b are moved maximally together in this manner, the circular portion 11 is concentric with the semicircular cutouts 21a, 21b. Thus, during use, the circular portion 11 serves as a beam-absorbing body, and the space between the circular portion 11 and the semicircular cutouts 21a, 21b defines a substantially annular beam aperture (i.e., the aperture is contiguously ring-shaped except where interrupted by the bridge 13) surrounding the circular portion 11. The annular aperture is transmissive to the charged particle beam (which also passes through the through-hole 8), while the circular portion 11 and structure surrounding the annular aperture absorb charged particles of the beam incident on such structure.

In the foregoing description, the circular portion 11 and cutouts 21a, 21b are emphasized by making them appear disproportionately large in FIGS. 1 and 2(a)–2(b). However, it will be understood that the cutouts 21a, 21b actually are no more than 100 μm in diameter, whereas the second members 2a, 2b and first member 1 are relatively quite large (a few millimeters and a few tens of millimeters wide, respectively).

Second Representative Embodiment

Figure 3A:
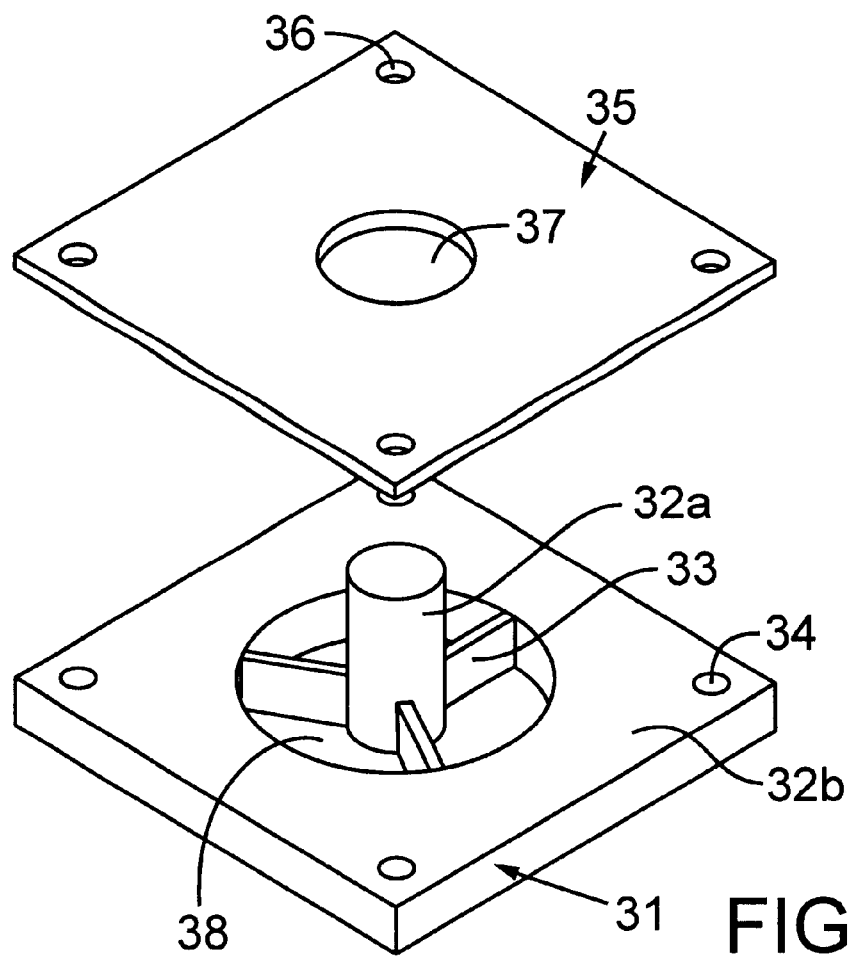
FIGS. 3a)–3(b) are respective isometric views of a hollow-beam aperture according to a second representative embodiment of the invention.
Figure 3B:
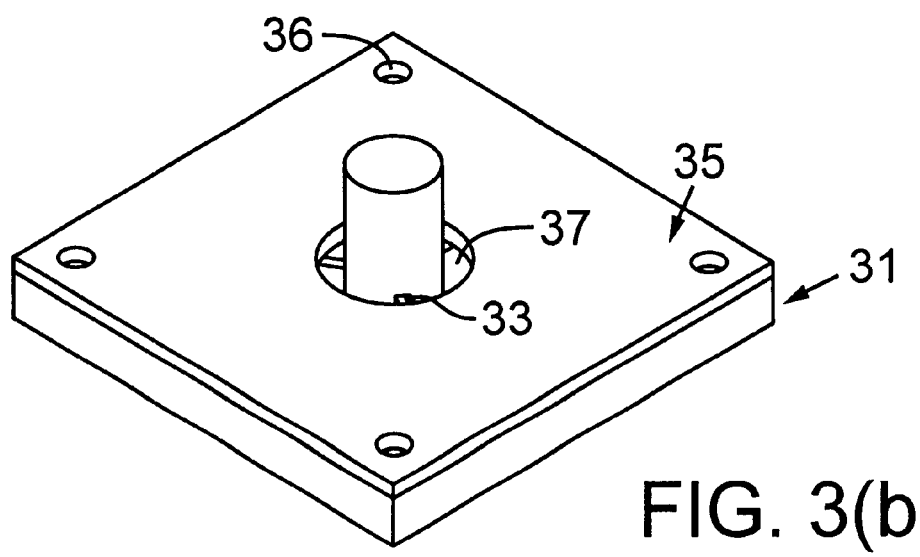

A hollow-beam aperture according to this embodiment is depicted in FIGS. 3(a)–3(b), and comprises a first member 31 and a second member 35 intended to be mounted together as shown in FIG. 3(b). The first member 31 comprises a central body 32a (desirably cylindrical in shape), a planar portion 32b surrounding the central body 32a, and radial supports 33 connecting the central body 32a to the planar portion 32b. The planar portion 32b defines fastening holes 34. The second member 35 defines fastening holes 36 and a beam-transmitting opening 37. Appropriate fasteners (e.g., screws, not shown) are inserted through respective fastening holes 34, 36 to mount the second member 35 to the first member 31.

The first member 31 defines a substantially circular through hole 38 in which the central body 32a is disposed centrally and coaxially, supported by the supports 33 (e.g., three supports 33 as shown). The first member 31 desirably is made of a heat-resistant material such as W, Mo, or sintered graphite, formed desirably by EDM as a single unit shaped as shown. The central body 32a is structured so that it extends above the plane of the first member 31 by at least the thickness of the second member 35. The second member 35 desirably is made from an approximately 0.5-mm-thick sheet of W, Mo, or sintered graphite.

In an assembled hollow-beam aperture according to this embodiment, the central body 32a functions as a beam-absorbing body. The central body 32a also can be used during fabrication of the hollow-beam aperture as an EDM electrode for cutting the opening 37 in the second member 35. The opening 37 desirably has a radius that is approximately 20 μm larger than the radius of the central body 32a. To assemble the hollow-beam aperture, the respective fastening holes 34, 36 in each corner are aligned with each other (FIG. 3(b)) and secured with screws or the like.

Figure 4:
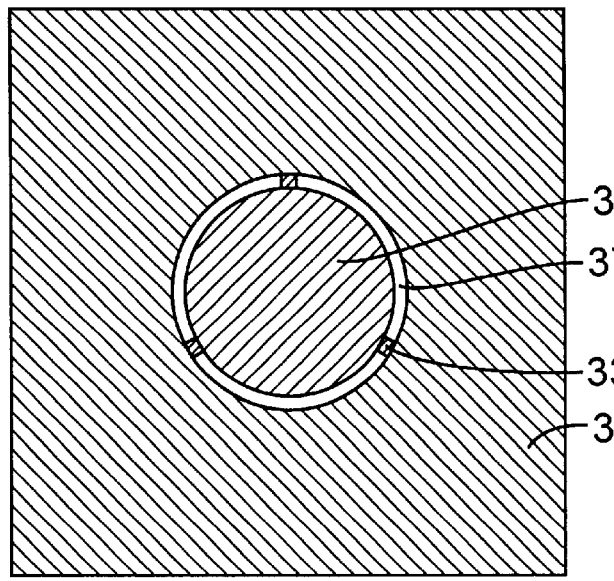
FIG. 4 is a plan view of the hollow-beam aperture according to the second representative embodiment.

Certain aspects of a top plan view of the assembled hollow-beam aperture according to this embodiment are shown in FIG. 4. In this figure, the annular gap between the central body 32a and the edge of the opening 37 readily can be seen. During EDM as described above, the outer edge of the opening 37 is formed due to the existence of a spark gap between the central body 32a and the second member 35 as the central body 32a is passed through the graphite sheet of the second member 35.

In FIGS. 3(a)–3(b) and 4 the central body 32a and opening 37 are emphasized by making them appear disproportionately large. Actually, the opening 37 typically is less than 100 μm in diameter, as in the first representative embodiment. The sizes of the first and second members, on the other hand, is arbitrary.

Third Representative Embodiment

Figure 5A:
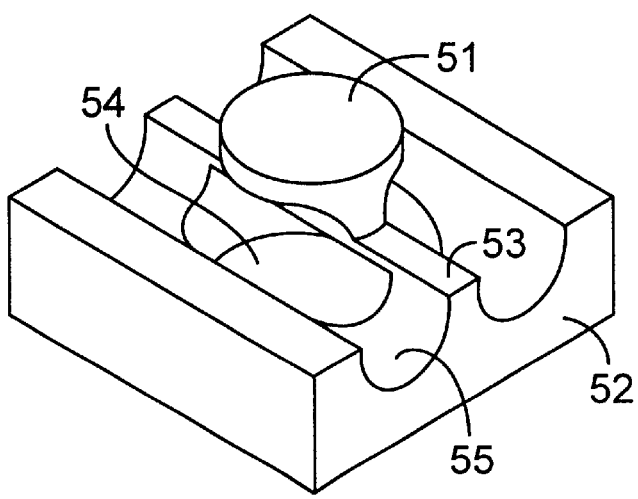
FIGS. 5(a)–5(b) are respective isometric views of a hollow-beam aperture according to a third representative embodiment of the invention.
Figure 5B:
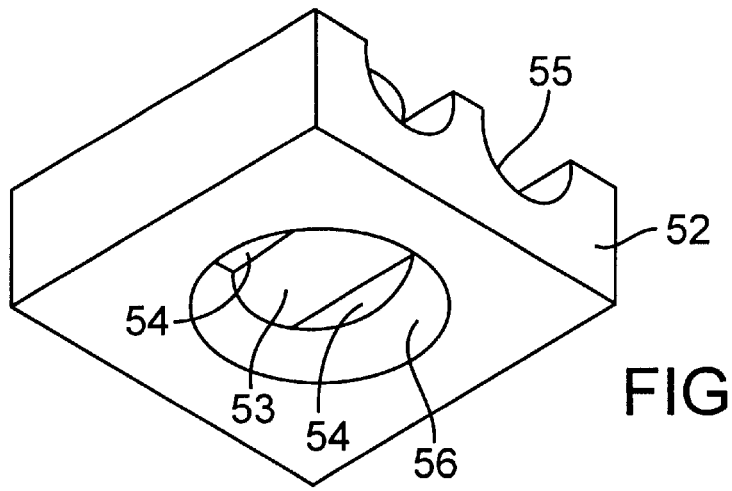

A hollow-beam aperture according to this embodiment is shown in FIGS. 5(a)–5(b), and the results of certain steps in the manufacture of this embodiment are depicted in FIGS. 6(a)–6(d), respectively. Each of FIGS. 5(a)–5(b) is an isometric view, wherein FIG. 5(a) is an upper oblique view and FIG. 5(b) is a lower oblique view.

The hollow-beam aperture comprises a main body 52 machined to have structural elements including a beam-absorbing body 51 and a support bar 53. The main body 52 also defines openings 54, 56 and spaces 55 that are best understood from a description of how the hollow-beam aperture of this embodiment is manufactured. Finally, when viewed axially (FIG. 6(d)), the hollow-beam aperture defines a substantially annular aperture 57 surrounding the beam-absorbing body 51.

Fabrication of the hollow-beam aperture is described with reference to FIGS. 6(a)–6(d). To make these figures easier to understand, the dimensions of the beam-absorbing body 51 and the annular aperture 57 are depicted larger than actual, compared to other structural features. In reality, the annular aperture 57 has an outer diameter of 100 μm or less, whereas the main body 52 has a width on each side of several millimeters.

Fabrication begins with a block 61 of a suitable rigid, beam-absorbing material such as W, Mo, or sintered carbon. The block 61 desirably has a rectangular parallelopiped shape. Turning the block 61 about an axis A allows a cylindrical portion 62 (rotationally symmetric about the axis A, destined to be the beam-transmission axis, and relatively thick in the axial direction) to be cut (FIG. 6(a)). The cylindrical portion 62 is destined to become the beam-absorbing body 51, and has a diameter $D_1$ and a "height" (along the axis A) of $H_1$. Thus, the remaining block 61 has a thickness $H_2$. Similarly, turning the block 61 about the axis A allows a cylindrical void 63 to be cut (rotationally symmetrical about the axis A; FIG. 6(b)). The void 63 essentially forms the circular opening 56, and has a diameter $D_3$ (wherein $D_1<D_3$) and a "height" $H_3$. Thus, of the original block 61, a rotationally symmetric shoulder 64 (having a "height" of $H_2-H_3$, and being relatively thin in the axial direction, i.e., $(H_2-H_3)<H_1$)) and a portion 65 (that is relatively thick in the axial direction) are left. Two cylindrical voids 66a, 66b are formed (e.g., by drilling) along respective axes that are perpendicular to the axis A (see FIG. 6(c), showing the full circumference of each void). The radius of each void 66a, 66b is selected such that, when the finished hollow-beam aperture is viewed from a direction along the axis A (FIG. 6(d)), the substantially annular aperture 57 is formed that is bisected by the support bar 53 and flanked by lateral bars 67. The three manufacturing steps described above and shown in FIGS. 6(a)–6(c), respectively, can be performed in any order.

In this embodiment, the cylindrical portion 62 has a diameter equal to the intended inner diameter of the annular aperture 57. The cylindrical void 63 desirably has a diameter equal to the intended outer diameter of the annular aperture 57. Thus, a structure is formed that, when viewed along the axis A, is rotationally symmetric (FIG. 6(d)). Along the axial direction, the cylindrical portion 62 is relatively thick, the shoulder 64 is relatively thin, and the lateral bars 67 are relatively thick.

As noted above, the voids 66a, 66b can be formed by drilling from a lateral direction perpendicular to the axis A, but such that the voids flank the axis A (FIG. 6(c)). Thus, the voids 66a, 66b remove part of the shoulder 64 that is relatively thin in the axial direction. (Compare FIG. 6(c)

with FIG. 6(b); also, as shown in FIG. 5(a), the only remaining portion of the shoulder 64 defines the support bar 53.)

The items shown in FIGS. 5(a)–5(b) and 6(a)–6(d) are related as follows when manufacture is complete:

- the cylindrical portion 62 is the beam-absorbing body 51, which is relatively thick in the axial direction;
- the wall 65 corresponds to the main body 52, which is relatively thick in the axial direction;
- portions remaining after machining of the rotationally symmetrical shoulder 64 correspond to the support bar 53, which is relatively thin in the axial direction; and
- the cylindrical void 63 corresponds to the opening 56.

As shown in FIG. 5(a), the individual openings 54 are somewhat crescent-shaped especially when viewed from a non-orthogonal direction. However, when viewed orthogonally from above, as shown in FIG. 6(d), with the beam-absorbing body 51 centrally situated over the opening 56, the openings 54 collectively appear as a complete ring (except for the support bars 53).

Fourth Representative Embodiment

Figure 7A:
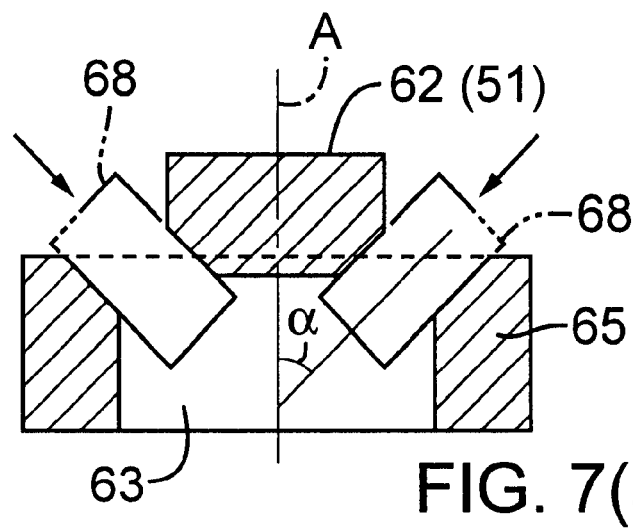
FIGS. 7(a)–7(b) are an elevational section and plan view, respectively, of a hollow-beam aperture according to a fourth representative embodiment of the invention.
Figure 7B:
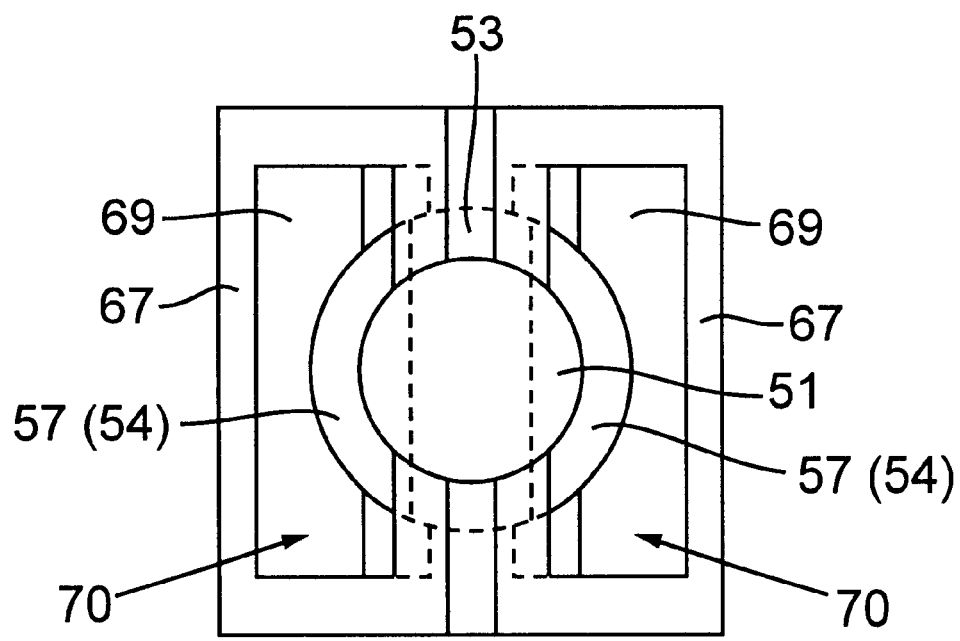

A hollow-beam aperture according to this embodiment is shown in FIGS. 7(a)–7(b). FIG. 7(a) depicts a step in the manufacture of the subject hollow-beam aperture.

Figure 6A:
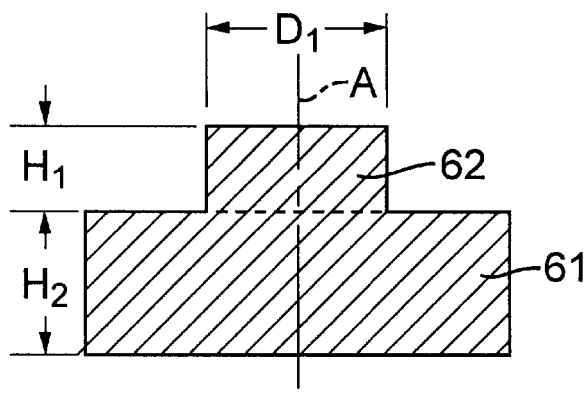
FIGS. 6(a)–6(d) depict the results of respective steps in the manufacture of a hollow-beam aperture according to the third representative embodiment, wherein each of FIGS. 6(a)–6(c) is an elevational section.
Figure 6B:
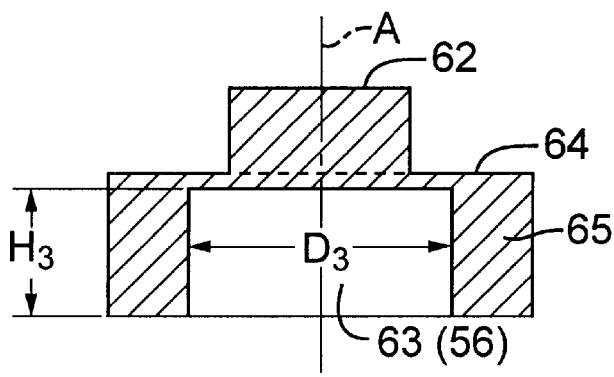
Figure 6C:
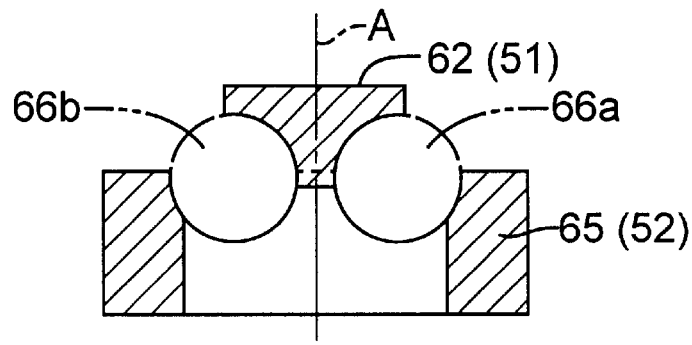
Figure 6D:
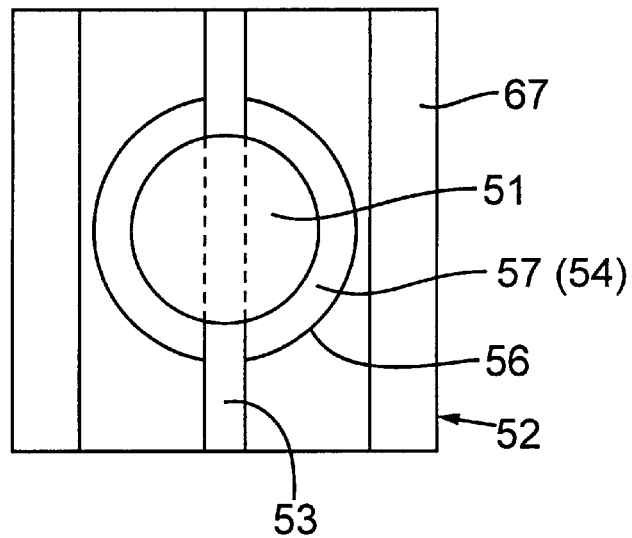

Two steps in the manufacture of this embodiment are the same as shown in FIGS. 6(a)–6(B), respectively, and described above in connection with the third representative embodiment. I.e., fabrication begins with a block of a suitable rigid, beam-absorbing material such as tungsten, molybdenum, or sintered carbon. Turning the block about the axis A allows the cylindrical portion 62 (rotationally symmetric about the axis A and relatively thick in the axial direction) to be cut. The cylindrical portion 62 is destined to become the beam-absorbing body 51. Similarly, turning the block about the axis A allows the cylindrical void 63 to be cut (rotationally symmetrical about the axis A). The diameter of the void 63 is destined to become the outer diameter of the annular aperture. Thus, of the original block, the cylindrical portion 62 (that is relatively thick in the axial direction), a rotationally symmetric shoulder 64 (that is relatively thin in the axial direction), and a portion 65 (that is relatively thick in the axial direction) are left (see FIG. 6(b)).

In FIG. 7(a), in contrast with FIG. 6(c), machining in a direction perpendicular to the axis A is performed using a suitable rectangular EDM electrode 68 tilted at an angle a relative to the axis A and urged (arrows) obliquely toward the axis A. Each resulting cut 70 has a rectangular transverse profile as shown in FIG. 7(a) and produces a respective sloping surface 69 flanked by a lateral bar 67 (FIG. 7(b)). Other features of this embodiment are similar to corresponding features of the third representative embodiment and have the same respective reference numerals.

After completion of the machining described above (in which the individual machining steps can be performed in any order), the resulting hollow-beam aperture has a substantially annular aperture 57 that is ring-shaped except for support bars 53 supporting the beam-absorbing body 51.

In this embodiment the annular aperture 57 has an inner diameter that is established by the diameter of the cylindrical portion 62, an outer diameter that is established by the diameter of the cylindrical void 63, and a radial width equal to the difference in these two diameters. Hence, the radial width of the annular aperture 57 can be made extremely small. Also, the annular aperture 57 is flanked by the sloped surfaces 69. Portions of an incident charged particle beam striking a sloped surface 69 are reflected diagonally, which prevents disturbance of the incident beam from stray particles generated by multi-path reflections.

An advantage of this embodiment over the third representative embodiment is that this embodiment requires less complex machining than the third representative embodiment, and thus can be made in less time. I.e., in the third representative embodiment the openings 16 are formed by drilling through the entire width (several millimeters) of the body 51, whereas the cuts 70 of the fourth representative embodiment are formed readily (typically about 100 $\mu$m wide) by EDM at respective locations flanking the ring-shaped opening 17. Also, the hollow-beam aperture of the fourth representative embodiment has greater mechanical strength than the third representative embodiment.

Fifth Representative Embodiment

Figure 8A:
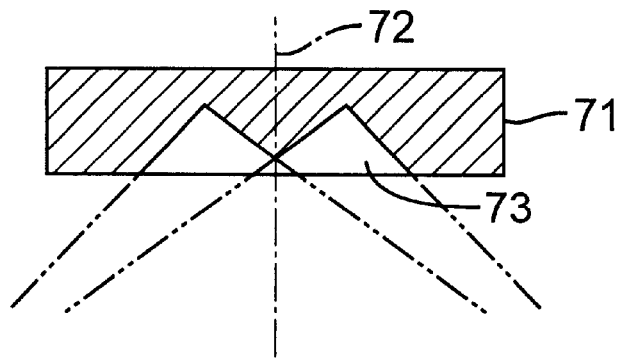
FIGS. 8(a)–8(d) depict the result of respective steps in the manufacture of a hollow-beam aperture according to a fifth representative embodiment, wherein each of FIGS. 8(a)–8(c) is an elevational section.

A hollow-beam aperture according to this embodiment is depicted in FIGS. 9(a)–9(b), and FIGS. 8(a)–8(d) depict the results of certain respective steps in the manufacture of a hollow-beam aperture according to this embodiment. The hollow-beam aperture is formed from a main body 71 having a center axis 72 (which will be the beam axis). The main body 71 defines a ring-shaped groove 73 having a triangular sectional profile as shown in FIG. 8(a), truncated pyramidal openings 74, a peripheral frame portion 75, a beam-absorbing body 76, a support bar 77, sloping surfaces 78, a planar surface 79, and a substantially ring-shaped opening 80.

To form the hollow-beam aperture of this embodiment, reference is made to FIGS. 8(a)–8(d). As shown in FIG. 8(a), the ring-shaped groove 73 (with triangular sectional profile) is machined into a bottom (in the figure) surface of the main body 71, about the axis 72. Cutting the groove 73 can be performed either by holding the main block 71 stationary and rotating a cutting tool about the axis 72, or holding the cutting tool stationary and rotating the main block 71 about the axis 72. This machining step can be performed using a lathe or by EDM.

Figure 8B:
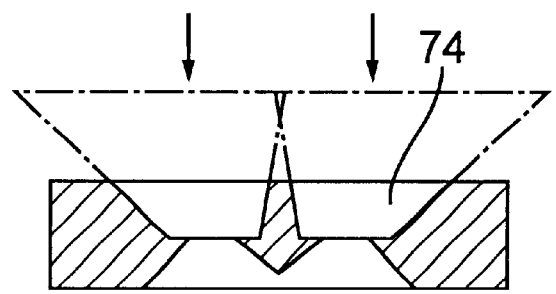

As shown in FIG. 8(b), the truncated pyramidal openings 74 are cut into the top (in the figure) surface of the main block 71 using complementary-shaped EDM electrodes (profiled by dash-dot lines) engaged perpendicularly (arrows) to the top surface. Each electrode has sloping sides. EDM machining is performed at bilaterally symmetrical positions relative to the center axis 72. EDM machining depths are set such that the width of the resulting ring-shaped opening 80 extending through the main block 71 after machining from above and below will be equal to the prescribed diameter of the hollow beam to be formed by the hollow-beam aperture of this embodiment.

Figure 8C:
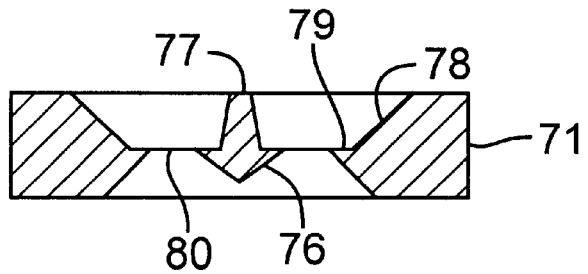
Figure 8D:
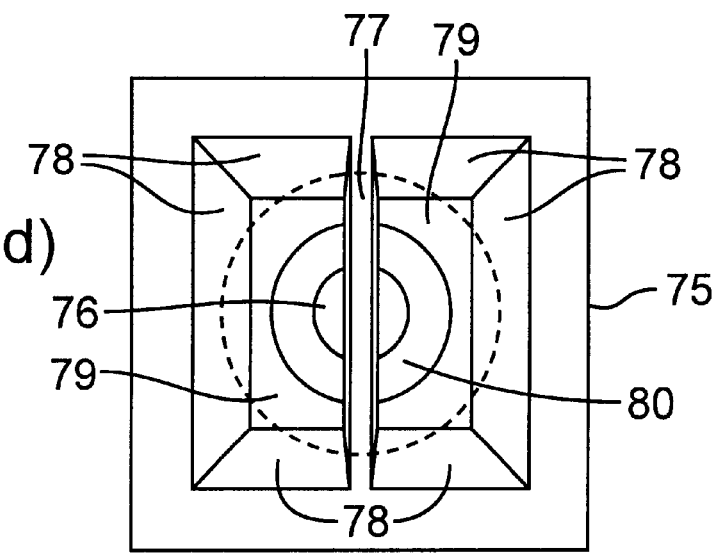
Figure 9A:
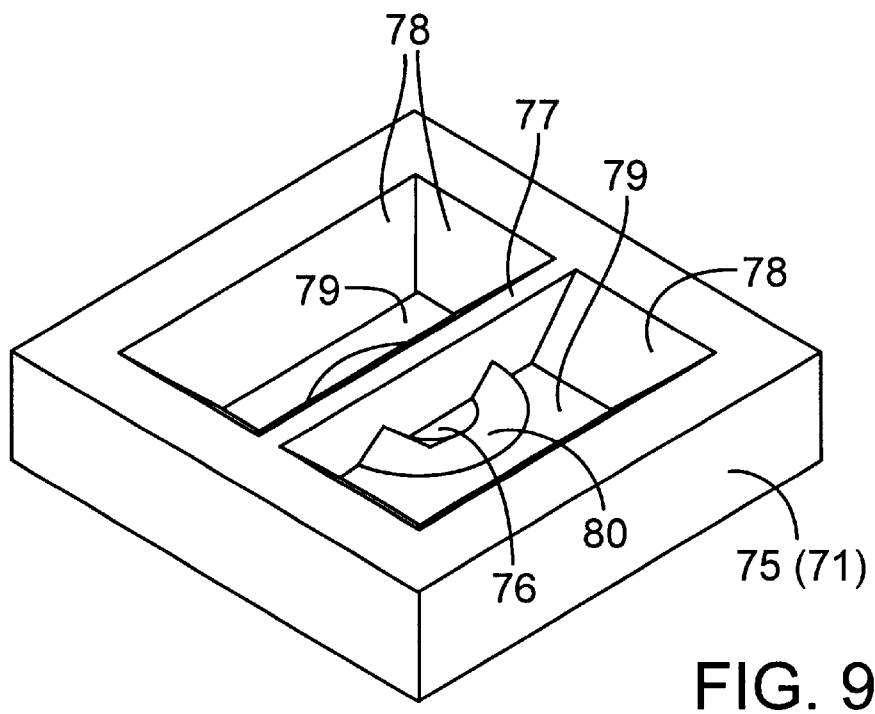
FIGS. 9(a)–9(b) are respective isometric views of the hollow-beam aperture according to the fifth representative embodiment.
Figure 9B:
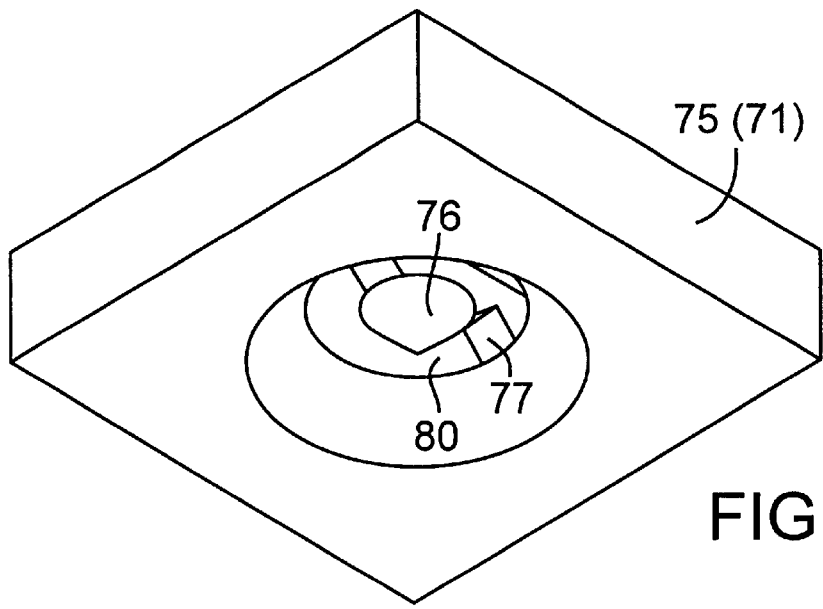

Sectional and plan views of the resulting hollow-beam aperture produced by the foregoing machining steps are shown in FIGS. 8(c) and 8(d), respectively. Isometric views of the hollow-beam aperture as seen from above and below are shown in FIGS. 9(a) and 9(b), respectively. These figures show the peripheral frame portion 75 and centrally located beam-absorbing body 76 supported relative to the frame portion 75 by the support bars 77. The beam-absorbing body 76 is surrounded by the substantially ring-shaped opening 80 and is coaxial with the center axis 72. The planar surface 79 is oriented perpendicularly to the center axis 72. The radial gap between the diameter of the base of the cone-shaped beam-absorbing body 76 and the outer diameter of the substantially ring-shaped opening 80 is configured to the prescribed value by using appropriate specifications for the downward-machining step (FIG. 8(b)), in view of the specifications used for the upward-machining step (FIG. 8(a)). Also, multi-path reflection problems are avoided by making the planar surfaces 79 as small as possible.

Because the beam-absorbing body 76 is made cone-shaped in this embodiment, it has a sharp edge residing in a plane perpendicular to the center axis 72 (i.e., the same plane as that of the planar surface 79). This configuration provides an ideal trimming of the beam regardless of the angle of incidence of the beam to the hollow-beam aperture. Also, the inner and outer circumferences of the substantially ring-shaped opening 80 can be made perfectly concentric because they are both defined by the same groove 73.

The sides of the support bars 77 desirably are sloped as shown. This allows the support bars 77 to be made as thin as possible, thereby minimizing possible adverse effects from the support bars 77 interfering with an inclined beam.

In each of representative embodiments three, four, and five, the beam-transmitting portion of the respective hollow-beam aperture was formed by machining voids in two locations. Alternatively, it will be understood that this machining could have been performed in three or more locations. Whenever the machining in performed in three locations, the beam-absorbing body is supported by three support bars. Also, in any of the third, fourth, and fifth representative embodiments, machining for forming the beam-transmitting portion desirably is performed at rotationally symmetric locations about the center of the aperture. In so doing, the formation of a ring-shaped beam having anisotropic characteristics can be avoided.

Sixth Representative Embodiment

Figure 10A:
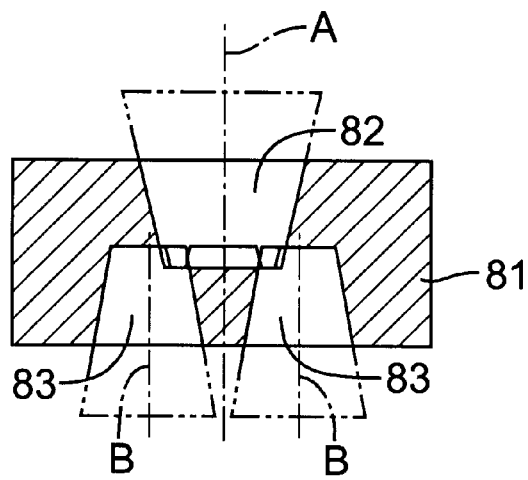
FIGS. 10(a)–10(c) are an elevational section, a plan view, and an isometric view, respectively, of a hollow-beam aperture according to a sixth representative embodiment of the invention.
Figure 10B:
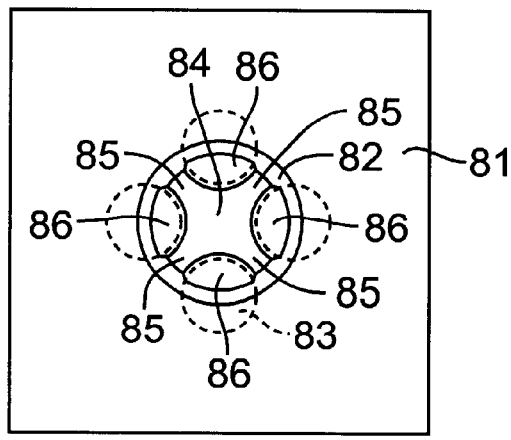
Figure 10C:
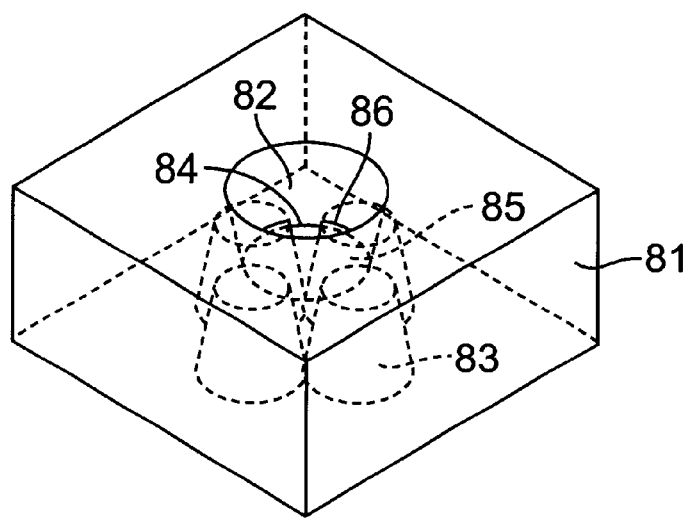

A hollow-beam aperture according to this embodiment is shown in FIGS. 10(a)–10(c), in which item 81 is a main block, items 82 and 83 are respective truncated conical openings, item 84 is a beam-absorbing body, item 85 is a support bar, and item 86 is a substantially ring-shaped opening.

The truncated conical opening 82 is formed in the main block 81 by machining from above (FIG. 10(a)). The opening 82 is formed with its axis A being perpendicular to the top (in the figure) surface of the main block 81. The axis A of the opening 82 will become the center axis of the beam-absorbing body 84. Four truncated conical openings 83 are machined with their respective axes B being perpendicular to the bottom (in the figure) surface of the main block 81. The respective axes B of the conical openings 83 are equidistant from, and rotationally-symmetric about, the axis A of the opening 82. Machining is performed such that portions of the opening 82 are situated over the openings 83 below it. The respective sizes, positions, and depths of the openings 82, 83 are such that a "passage" (comprising openings 86) is formed through the structure.

Plan and isometric views of a structure machined in this manner are provided in FIGS. 10(b) and 10(c), respectively. In the center of the structure is the beam-absorbing body 84, which is supported in the main block 81 (as the equivalent of a first member) by four supports 85. Formed around the beam-absorbing body 84 is a substantially ring-shaped opening comprising four segments 86. The outer diameter of the beam-absorbing body 84 (i.e., the diameter of a circle inscribed in the beam-absorbing body 84) and the outer diameter of the substantially ring-shaped opening 86 (i.e., the diameter of a circle circumscribing the segments 86) are established by using the proper respective values for the size, location, and depth of the openings 82 and 83 above and below it, respectively. Hence, a substantially ring-shaped aperture, having a prescribed width and thickness, is provided in this representative embodiment.

In this embodiment, the side wall of the truncated conical opening 82 desirably is sloped. Such a configuration reflects an incident beam at an angle that prevents multi-path reflection problems. Also, because the substantially ring-shaped opening 86 is formed in a plane that is perpendicular to the center axis A of the beam-absorbing body 84, the ring-shaped opening can achieve an ideal trimming of the beam, regardless of the angle of incidence of the beam to the hollow-beam aperture. In addition, because the substantially ring-shaped (annular) opening 86 is rotationally symmetric about the axis A, anisotropism of a beam passing through the annular aperture can be eliminated.

Seventh Representative Embodiment

Figure 11A:
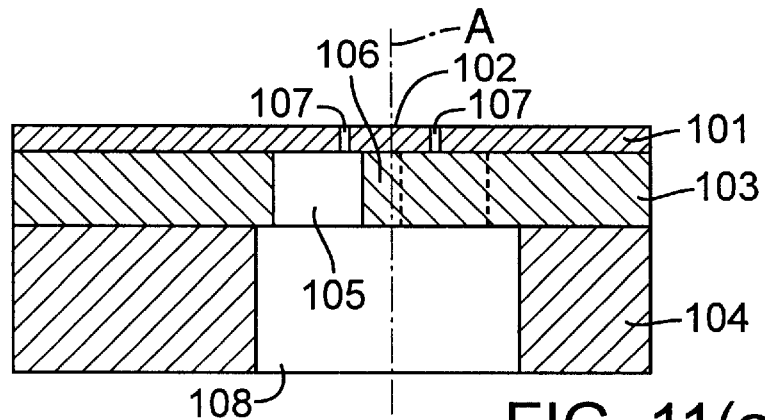
FIGS. 11(a)–11(b) are an elevational section and plan view, respectively, of a hollow-beam aperture according to a seventh representative embodiment of the invention.
Figure 11B:
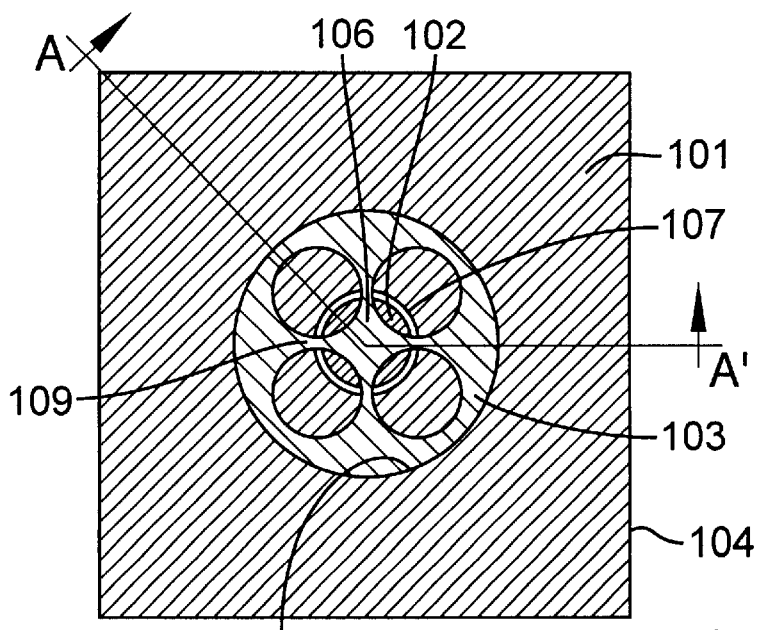
Figure 12:
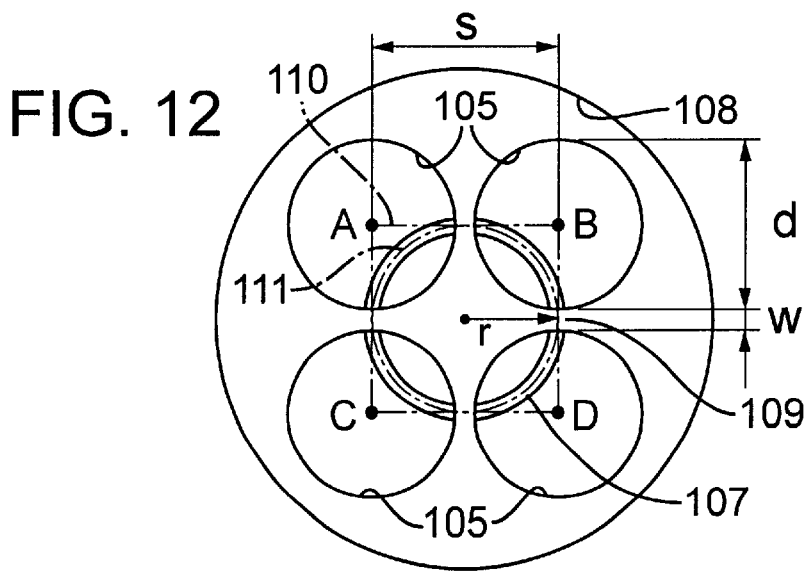
FIG. 12 is a plan view showing certain exemplary geometric relationships of the hollow-beam aperture according to the seventh representative embodiment.

A hollow-beam aperture according to this embodiment is shown in FIGS. 11(a)–11(b), and 12.

Figure 17:
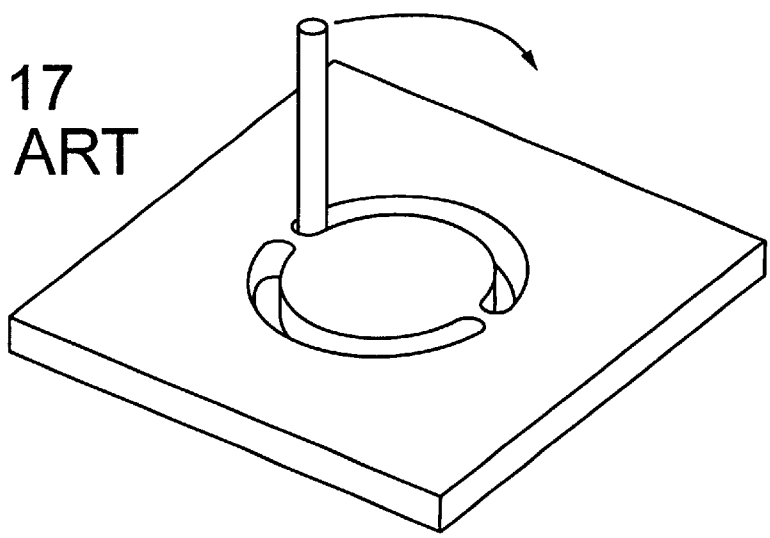
FIG. 17 is an isometric view of a conventional method for manufacturing a hollow-beam aperture.

In a conventional hollow-beam aperture as shown in FIG. 17, the thickness in the axial direction is relatively thin. Consequently, the hollow-beam aperture has a correspondingly low rigidity, which can result in distortion or fracture of the hollow-beam aperture. On the other hand, if the axial thickness of the hollow-beam aperture of FIG. 17 were to be increased to reduce distortion, then manufacture of the hollow-beam aperture would be made correspondingly more difficult; also, propagation of the beam through the substantially annular aperture may be impaired due to collision of particles of the beam with side walls of the openings. Since a beam incident in a normal manner to such a hollow-beam aperture typically can have an inclination (relative to the axis) of, for example, 8 mrad, a hollow-beam aperture configured as shown in FIG. 17 exhibits a significant absorption and scattering of incident charged particles in the beam.

Reference now is made to FIGS. 11(a)–11(b), wherein FIG. 11(a) is an elevational section along the line A–A' of FIG. 11(b). The hollow-beam aperture according to this embodiment comprises three portions 101, 103, 104 that can be made as three separate respective items laminated together, or as a single integrated unit. The portion 101 is a "charged-particle" ("CP") stop member, the portion 103 is a support member, and the portion 104 is an optional reinforcing member. The CP-stop member 101 defines an annular-shaped cutout 107 that serves to define a beam-absorbing member 102. The support member 103 defines multiple (e.g., four) openings 105 each being, for example, desirably circular with a diameter of 170 $\mu$m. The reinforcing member 104 is optional; if a combination of the CP-stop member 101 and support member 103 provides sufficient rigidity to prevent distortion of the CP-stop member, then the reinforcing member 104 can be deleted. If present, the reinforcing member 104 defines an opening 108 that desirably is circular with a diameter of, e.g., 300 $\mu$m and that is concentric with the substantially annular opening 107. A representative thickness of the reinforcing member 104 is 300 $\mu$m.

The support member 103 supports the CP-stop member 101. Hence, the CP-stop member 101 can be thin with low rigidity. (However, the CP-stop member 101 desirably is sufficiently thick to absorb incident charged particles; a representative thickness is 50 $\mu$m.). A representative thickness of the support member is 150 $\mu$m.

In the configuration of FIGS. 11(a)–11(b), the support member 103 defines four circular openings 105 equiangularly and equi-radially spaced about the axis A. The portions of the support member 103 extending between the openings 105 serve as support bars 109 for a region 106 of the support member 103 that support the beam-absorbing member 102. Each opening 105 can have a relatively small diameter (e.g., 170 $\mu$m). But, if the support member 103 is sufficiently thick to maintain requisite rigidity of the hollow-beam aperture, then portions of an incident beam divergently propagating through the substantially annular aperture 107 may be blocked by collision with a wall of an opening 105. In such a case, the diameter of the openings 105 can be increased as appropriate and the reinforcing member 104 be included to maintain adequate rigidity of the hollow-beam aperture. If the reinforcing member 104 is included, then the opening 108 desirably has a relatively large diameter (e.g., 300 µm) to prevent the beam colliding with a wall of the opening 108 during passage of the beam through the hollow-beam aperture.

FIG. 12 shows representative positional relationships of the various openings 105, 107, 108 of this embodiment. In the configuration of FIG. 5, the center of each opening 105 is coincident at a respective apex A, B, C, D of a square 110. The square 110 has sides each having a length "s". The square 110 is tangent to a circle 11 having a radius "r" that is the midline of the substantially annular aperture 107. Each support bar 109 has a width "w", wherein d=s−w.

Figure 13A:
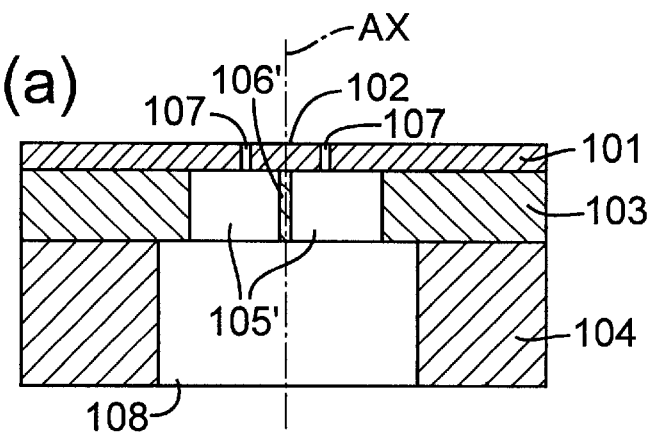
FIGS. 13(a)–13(b) are an elevational section and plan view, respectively, of an alternative configuration of a hollow-beam aperture according to the seventh representative embodiment.
Figure 13B:
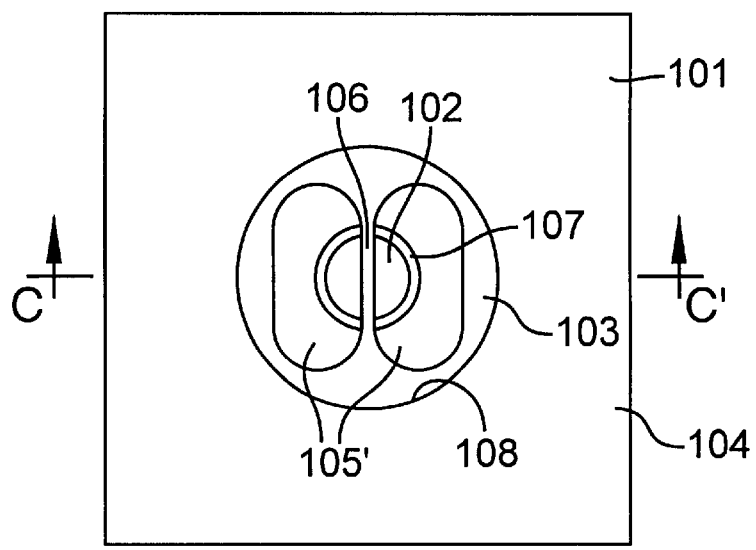

An alternative configuration of a hollow-beam aperture according to this embodiment is shown in FIGS. 13(a)–13(b), wherein FIG. 13(a) is an elevational section along the line C–C' of FIG. 13(b), and components that are similar to components shown in FIGS. 11(a)–11(b) have the same respective reference numerals. The configuration of FIGS. 13(a)–13(b) includes only two openings 105' (analogous to the openings 105 in the configuration of FIG. 11(b)). Each opening 105' has a profile that is extended from circular (i.e., each opening 105' is an elongated slot with full-radius ends). Such a configuration exhibits reduced beam blocking, compared to the configuration of FIGS. 11(a)–11(b). However, the circular openings 105 in the configuration of FIGS. 11(a)–11(b) generally are easier to make than the openings 105'.

The material used to manufacture a hollow-beam aperture according to this embodiment desirably is tantalum, molybdenum, or graphite. Graphite has the lowest cost. The openings desirably are formed by EDM or mechanical machining.

In any of the embodiments described herein, the member situated at the center of the hollow-beam aperture has been referred to as a "beam-absorbing member" that blocks propagation of the incident beam through it. The center member alternatively can be a "beam-scattering member" that transmits the beam (while scattering the beam). In the alternative situation, a scattering aperture desirably is situated axially downstream to block propagation of the particles scattered by the center member (see item 47 in FIG. 17, discussed below).

Eighth Representative Embodiment

Figure 14:
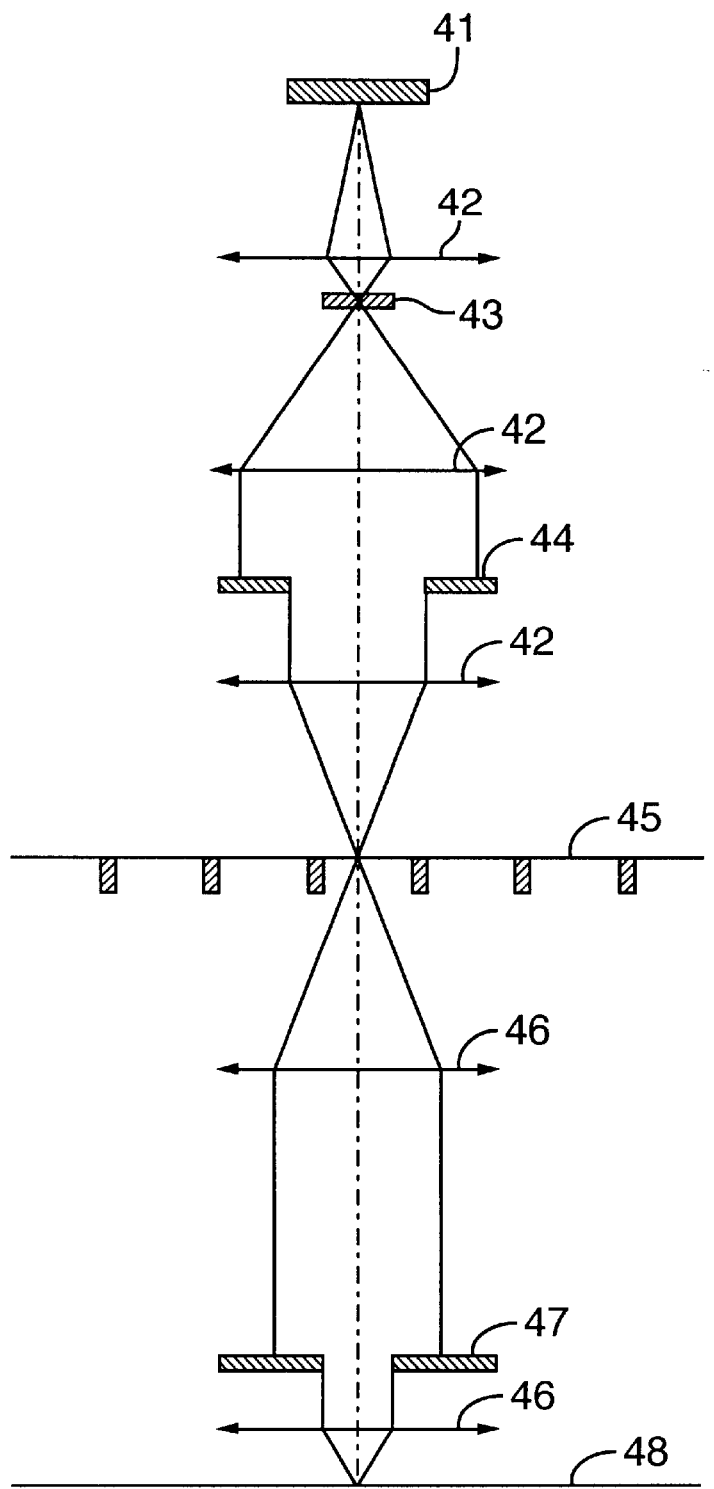
FIG. 14 is a schematic elevational diagram of the charged-particle-beam (CPB) optical system of a CPB microlithography apparatus according to a seventh representative embodiment.

This embodiment of a charged-particle-beam (CPB) microlithography apparatus is shown in FIG. 14. The apparatus comprises a CPB source 41, illumination lenses 42, a hollow-beam aperture 43 such as any of the embodiments described above, a first aperture stop 44, a reticle 45, projection lenses 46, a second aperture stop ("scattering aperture") 47, and a substrate (wafer) 48.

As in a conventional CPB microlithography apparatus, the illumination lenses 42 cause the reticle 45 to be illuminated uniformly by a charged particle beam emitted from the CPB source 41. A pattern defined by the reticle 45 is imaged on the substrate 48 by the projection lenses, which form a latent image in a layer of resist on the wafer 48. The aperture stops 44, 47 are provided to shield the wafer 48 from scattered charged particles.

As noted above, the FIG. 14 embodiment includes a hollow-beam aperture 43 desirably situated at a beam crossover (an axial location where the charged particle beam converges). Placing the hollow-beam aperture 43 at a crossover provides maximal effectiveness of the hollow-beam aperture 43 in preventing Coulomb effects. Although a hollow-beam aperture 43 placed at a crossover normally experiences heating to an extremely high temperature by absorption of particles of the charged particle beam, a hollow-beam aperture according to the present invention withstands such high temperatures extremely well. This is because, inter alia, the hollow-beam aperture is made of a material that can withstand high temperatures, such as sintered graphite, tantalum, or molybdenum, and constructed as described above. Another problem with placing the hollow-beam aperture at a crossover is that the beam is very small in transverse profile at such a location. Consequently, an annular aperture must have an extremely narrow radial width to make the hollow center of the beam large enough while achieving the desired reduction in Coulomb effects. Hollow-beam apertures according to the invention provide, for the first time, annular apertures that are sufficiently narrow in radial width (e.g., 20 µm) to be effective at the crossover.

Ninth Representative Embodiment

Figure 15:
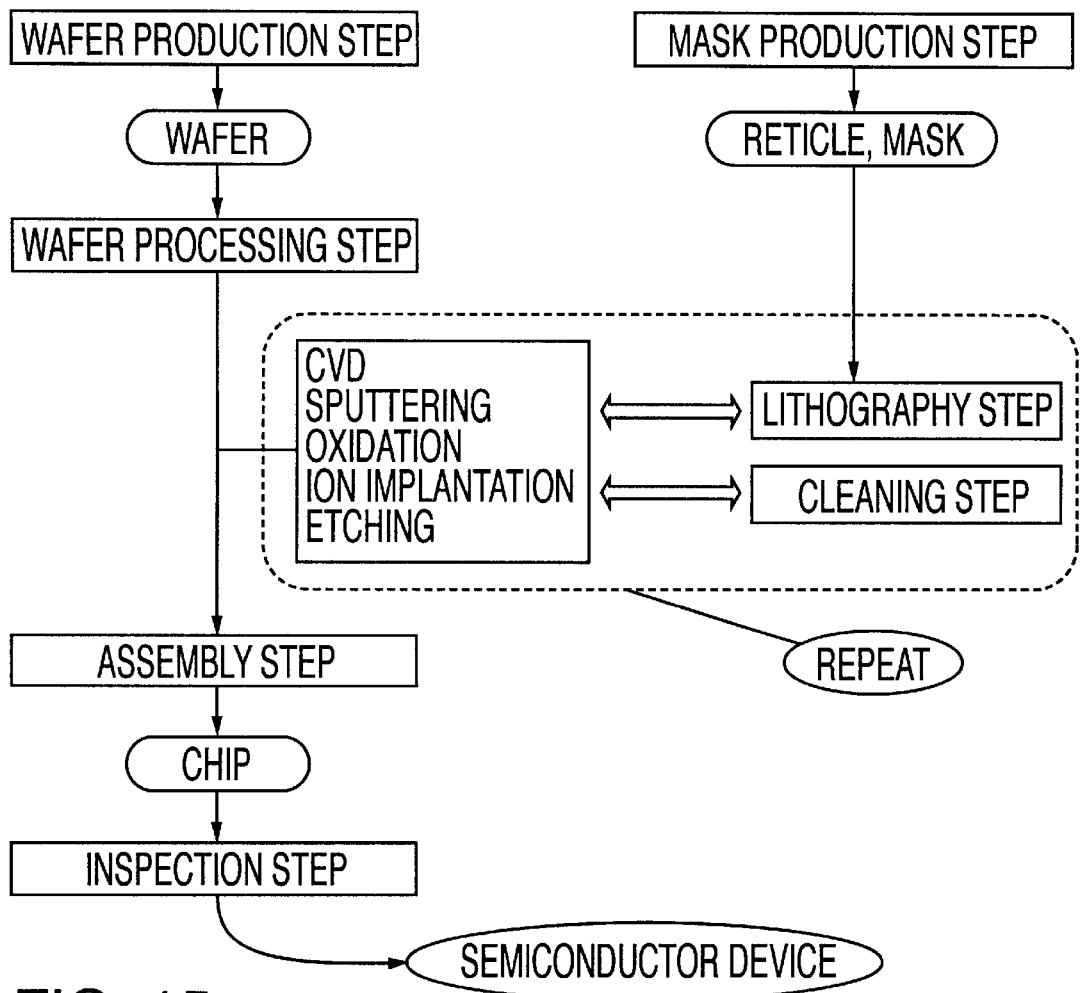
FIG. 15 is a process flowchart for manufacturing a microelectronic device, wherein the process includes a microlithography step that utilizes a CPB microlithography apparatus according to the invention.

FIG. 15 is a flowchart of an exemplary microelectronic-device fabrication method to which apparatus and methods according to the invention readily can be applied. The fabrication method generally comprises the main steps of wafer production (wafer fabrication and preparation), wafer processing, device (chip) assembly (including dicing, lead connections, and chip packaging), and device inspection. Each step usually comprises several sub-steps.

Among the main steps, wafer (substrate) processing is key to achieving the smallest feature sizes (critical dimensions) and best inter-layer registration. In the wafer-processing step, multiple circuit patterns are layered successively atop one another on the wafer, wherein the formation of each layer typically involves multiple sub-steps. Usually, many operative microelectronic devices (e.g., memory chips or CPUs) are produced on each wafer.

Typical wafer-processing steps include: (1) thin-film layer formation involving formation of a dielectric layer for electrical insulation or a metal layer for forming interconnects and electrodes; (2) oxidation of the thin-film layer or wafer substrate; (3) microlithography to form a resist pattern, for selective processing of the thin film or the substrate itself, according to a reticle; (4) etching or analogous step to etch the thin film or substrate according to the resist pattern; (5) impurity doping or implantation (e.g., by ion bombardment or diffusion) as required to implant ions or impurities into the thin film or substrate according to the resist pattern; (6) resist stripping to remove the resist from the wafer; and (7) wafer inspection. Wafer processing is repeated as required (typically many times) to fabricate the desired microelectronic device(s) on the wafer.

Figure 16:
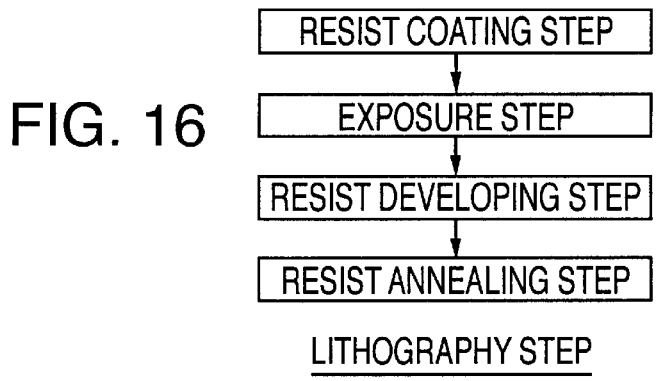
FIG. 16 is a process flowchart for performing microlithography using a CPB microlithography apparatus according to the invention.

FIG. 16 provides a flowchart of typical steps performed in microlithography, which is a principal step in wafer (substrate) processing. The microlithography step typically includes: (1) resist-coating step, wherein a suitable resist is coated on the wafer or wafer substrate (which can include a circuit element formed in a previous wafer-processing step; (2) exposure step, to expose the resist with the desired pattern; (3) development step, to develop the exposed resist; and (4) optional resist-annealing step, to enhance the durability of the resist pattern.

Details of the microelectronic-device manufacturing process outlined above are well known by persons of ordinary skill in the art, and hence do not require elaboration here.

Whereas the invention has been described in connection with multiple representative embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. A hollow-beam aperture for a charged-particle-beam (CPB) microlithography apparatus, comprising:

a first member, multiple second members, and a circular center member made of a CPB-absorbing material, the circular member having a radius;

the center member being supported relative to the first member by support bars extending radially from the first member to the center member;

the second members being situated between the support bars and the first member, and the second members being displaceable relative to the first member radially toward the center member;

the second members each having a distal edge, the distal edges being configured to engage the support bars whenever the second members are displaced maximally toward the center member; and the distal edges each defining a cutout having a respective edge configured as an arc having a radius greater than the radius of the center member such that, whenever the second members are displaced maximally toward the center member, a substantially annular aperture is defined between the center member and the cutouts.

2. The hollow-beam aperture of claim 1, further comprising a respective spring situated relative to the first member and each of the second members, the springs being configured to urge the respective second members toward the center member, and the springs being contiguous with the first and second members and connecting the respective second members to the first member.

3. The hollow-beam aperture of claim 1, wherein:

the first member defines angled edges in a region between the second members; and each second member defines angled edges that conform to and contact corresponding angled edges of the first member in a manner, whenever the second members are displaced maximally toward the center member, serving to maintain concentricity of the cutouts relative to the center portion.

4. A CPB microlithography apparatus, comprising the hollow-beam aperture of claim 1.

5. A hollow-beam aperture for a charged-particle-beam microlithography apparatus, comprising:

a first member defining a cutout having a radial dimension;

a cylindrical beam-absorbing member having an axis and a radius relative to the axis, the radius of the beam-absorbing member being smaller than the radial dimension of the cutout;

multiple support bars supporting the beam-absorbing member relative to the first member and concentrically with the cutout such that the axis of the beam-absorbing member is perpendicular to the plane of the first member, and the beam-absorbing member extends through the cutout, thereby forming a substantially annular aperture between the beam-absorbing member and the first member; and a second member defining a circular cutout having a radius no larger than the radial dimension of the cutout in the first member and larger than the radius of the beam-absorbing member, the second member being configured to be attached superposedly to the first member such that the cutout of the second member is coaxial with the beam-absorbing member, and the beam-absorbing member also extends through the second cutout.

6. A CPB microlithography apparatus, comprising the hollow-beam aperture of claim 5.

7. A hollow-beam aperture, comprising:

a main body defining a circular opening having an axis and a radius;

a beam-absorbing body situated concentrically relative to the circular opening and connected to the main body by at least one support bar contiguous with the main body and the beam-absorbing body, the beam-absorbing body having a radius that is smaller than the radius of the circular opening; and the main body defining at least one void situated relative to the circular opening and the beam-absorbing body, the void being configured so as to cause the circular opening and beam-absorbing body to define a substantially annular beam-transmitting aperture, when the hollow-beam aperture is viewed along the axis, extending through the main body and concentric with the beam-absorbing body.

8. The hollow-beam aperture of claim 7, wherein the circular opening has outer sides and tapered inner sides.

9. The hollow-beam aperture of claim 8, wherein the beam-absorbing body is conical relative to the axis.

10. The hollow-beam aperture of claim 7, wherein the beam-absorbing body is defined by a portion of the main body that is relatively thick in a beam-transmission direction, and the substantially annular beam-transmitting aperture is defined by a portion of the main body that is relatively thin in the beam-transmission direction.

11. The hollow-beam aperture of claim 10, wherein the circular opening is machined by EDM using the beam-absorbing body as an EDM electrode.

12. The hollow-beam aperture of claim 7, wherein the circular opening has a truncated conical profile as viewed along a direction perpendicular to the axis of the beam-absorbing body, the circular opening extending into the main body from a first surface of the main body.

13. The hollow-beam aperture of claim 12, wherein:

the main body defines at least two voids each having a respective axis that is parallel to the axis of the beam-absorbing body, the voids extending into the main body from a second surface of the main body opposite the first surface;

the voids are arranged such that their respective axes are spaced equally from one another about the axis of the beam-absorbing body in a rotationally symmetric manner; and each of the voids intersects, within the main body, a respective portion of the circular opening.

14. The hollow-beam aperture of claim 13, wherein each of the voids has a truncated conical profile as viewed along a direction perpendicular to the axis of the beam-absorbing body.

15. A CPB microlithography apparatus, comprising the hollow-beam aperture of claim 7.

16. A method for manufacturing a hollow-beam aperture for use in a charged-particle-beam (CPB) microlithography apparatus, comprising:

(a) providing a main body made of a CPB-absorbing material;

(b) on a first surface of the main body, machining a circular opening having an axis and a radius;

(c) on a second surface of the main body opposite the first surface, machining the main body to define a beam-absorbing body concentrically relative to the circular opening, the beam-absorbing body having a radius smaller than the radius of the circular opening, the circular opening and the beam-absorbing body each having a relatively thick dimension in a beam-transmission direction and being separated from each other by a portion of the main body that is relatively thin in the beam-transmission direction; and (d) machining the main body to define at least one void situated relative to the circular opening and the beam-absorbing body, the void being configured so as to cause the circular opening and the beam-absorbing body to define a beam-transmitting aperture that is concentric with the beam-absorbing body and substantially annular in profile when viewed along the axis, the beam-transmitting aperture extending through the portion of the main body, between the beam-absorbing body and the circular opening, that is relatively thin in the beam-transmission direction.

17. The method of claim 16, wherein step (b) comprises machining the circular opening to have a truncated conical profile as viewed along a direction perpendicular to the axis, and to extend into the main body from the first surface.

18. The method of claim 16, wherein step (b) comprises machining an annular groove in the first surface.

19. A microelectronic-device fabrication process, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a CPB microlithography apparatus as recited in claim 4; and using the CPB microlithography apparatus to expose the resist with the pattern defined on the reticle.

20. A microelectronic-device fabrication process, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a CPB microlithography apparatus as recited in claim 6; and using the CPB microlithography apparatus to expose the resist with the pattern defined on the reticle.

21. A microelectronic-device fabrication process, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a CPB microlithography apparatus as recited in claim 15; and using the CPB microlithography apparatus to expose the resist with the pattern defined on the reticle.

22. A method for manufacturing a hollow-beam aperture for use in a charged-particle-beam (CPB) microlithography apparatus, comprising:

(a) providing a main body made of a CPB-absorbing material;

(b) on a first surface of the main body, machining an annular opening having an axis and a radius, and defining a beam-absorbing body having a radius smaller than the radius of the annular opening, the annular opening and the beam-absorbing body each having a relatively thick dimension in a beam-transmission direction and being separated from each other by a portion of the main body that is relatively thin in the beam-transmission direction; and (c) machining the main body to define at least one void situated relative to the annular opening and the beam-absorbing body, the void being configured so as to cause the annular opening and the beam-absorbing body to define a beam-transmitting aperture that is concentric with the beam-absorbing body and substantially annular in profile when viewed along the axis, the beam-transmitting aperture extending through the portion of the main body, between the beam-absorbing body and the annular opening, that is relatively thin in the beam-transmission direction.

23. A hollow-beam aperture for a charged-particle-beam (CPB) microlithography apparatus, comprising:

a charged-particle-stopping member defining a cutout extending along an axis through a thickness dimension of the charged-particle-stopping member; and a support member defining multiple openings, the support member being situated relative to the cutout in the charged-particle-stopping member so as to collectively define a substantially annular aperture coaxial with the axis.

24. The hollow-beam aperture of claim 23, further comprising a reinforcing member defining an opening coaxial with the axis.

25. The hollow-beam aperture of claim 24, wherein the charged-particle-stopping member, the support member, and the reinforcing member are integrated as a unitary construct.

26. A method for manufacturing a hollow-beam aperture for use in a charged-particle-beam (CPB) microlithography apparatus, comprising:

(a) providing a main body having first and second main surfaces and a thickness dimension extending along an axis between the first and second main surfaces;

(b) defining multiple second openings extending from the first main surface into the thickness dimension, the second openings being situated radially symmetrically relative to the axis;

(c) defining a third opening extending from the second main surface into the thickness dimension, the third opening being situated coaxially with the axis and intersecting the second openings in the thickness dimension so as to define a substantially annular aperture as viewed along the axis.

27. The method of claim 26, further comprising the steps:

before, step (b), defining a first opening extending along the axis from the second main surface into the thickness dimension, the first opening having a bottom surface; and step (b) comprises defining the multiple second openings extending from the bottom surface further into the thickness dimension from the bottom surface.

* * * * *

UNITED STATES PATENT AND TRADEMARK OFFICE
CERTIFICATE OF CORRECTION

PATENT NO. : 6,635,891 B1
DATED : October 21, 2003
INVENTOR(S) : Nakano et al.

It is certified that error appears in the above-identified patent and that said Letters Patent is hereby corrected as shown below:

Column 1,
Line 31, "than of a" should read -- than that of a --

Column 7,
Line 9, "2(a)-2(b) plan" should read -- 2(a)-2(b) are plan --

Column 8,
Line 45, "5b is threaded" should read -- 5b and is threaded --

Column 9,
Line 50, "each comer" should read -- each corner --.

Column 11,
Line 26, "6(a)-6(B)" should read -- 6(a)-6(b) --
Liens 46-47, "angle a relative" should read -- angle α relative --

Column 14,
Line 55, "50 μm.)." should read -- 50 μm.) --

Column 15,
Line 15, "circle 11" should read -- circle 111 --

Column 16,
Line 58, "step;" should read -- step); --

Signed and Sealed this

Sixteenth Day of November, 2004

JON W. DUDAS
*Director of the United States Patent and Trademark Office*